(12) United States Patent
Shiozawa et al.

(10) Patent No.: US 7,842,962 B2
(45) Date of Patent: *Nov. 30, 2010

(54) NITRIDE SEMICONDUCTOR DEVICE AND METHOD OF MANUFACTURING THE SAME

(75) Inventors: Katsuomi Shiozawa, Tokyo (JP); Toshiyuki Oishi, Tokyo (JP); Kazushige Kawasaki, Tokyo (JP); Yuji Abe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 567 days.

This patent is subject to a terminal disclaimer.

(21) Appl. No.: 11/274,422

(22) Filed: Nov. 16, 2005

(65) Prior Publication Data
US 2006/0108596 A1  May 25, 2006

(30) Foreign Application Priority Data
Nov. 22, 2004  (JP) .............. 2004-337282

(51) Int. Cl.
*H01L 33/00* (2010.01)
(52) U.S. Cl. .................. 257/99; 438/48
(58) Field of Classification Search ......... 257/735, 257/99
See application file for complete search history.

(56) References Cited
U.S. PATENT DOCUMENTS

| | | | | |
|---|---|---|---|---|
| 6,653,215 | B1 * | 11/2003 | Brown et al. | 438/600 |
| 2002/0081800 | A1 * | 6/2002 | Morita | 438/237 |
| 2002/0121863 | A1 * | 9/2002 | Morishita | 315/169.3 |
| 2008/0116575 | A1 * | 5/2008 | Shiozawa et al. | 257/750 |

FOREIGN PATENT DOCUMENTS

JP   2000-223742 A   8/2000

OTHER PUBLICATIONS

Joon Seop Kwak, et al. "Temperature-Dependent Contact Resistivity of the Nonalloyed Ohmic Contacts to p-GaN"; Journal of Applied Physics; vol. 95; No. 10; May 15, 2004; pp. 5917-5919.

* cited by examiner

*Primary Examiner*—Thao X Le
*Assistant Examiner*—Kimberly Trice
(74) *Attorney, Agent, or Firm*—Oblon, Spivak, McClelland, Maier & Neustadt, L.L.P.

(57) ABSTRACT

A P-type electrode material is provided on a top surface of a P-type contact layer. The P-type electrode material is formed with an AuGa film, an Au film, a Pt film, and an Au film. The AuGa film is provided on the P-type contact layer. The Au film is provided on the AuGa film. The Pt film is provided on the Au film. The Au film is provided on the Pt film. With this, a nitride semiconductor device having a P-type electrode which can decrease a contact resistance between a P-type contact layer and the P-type electrode is obtained.

4 Claims, 5 Drawing Sheets

25%＜X＜65%

650＜X＜860℃

2%＜X＜48%

NITRIDE SEMICONDUCTOR DEVICE AND METHOD OF MANUFACTURING THE SAME

BACKGROUND OF THE INVENTION

1. Field of the Invention

The present invention relates to a nitride semiconductor device including a P-type electrode and a method of manufacturing the same.

2. Description of the Background Art

In a conventional nitride semiconductor device, palladium (Pd) is used as a material of a P-type electrode formed on a P-type contact layer (for example, "Temperature-dependent contact resistivity of the nonalloyed ohmic contacts to p-GaN", Joon Seop Kwak et al., JOURNAL OF APPLIED PHYSICS, VOLUME 95, NUMBER 10, May 15, 2004, PP. 5917-5919).

When a laser diode, for example, is manufactured using the nitride semiconductor device as described above, if a P-type contact resistance is not sufficiently low, an operation voltage for operating the laser diode is increased and properties of the laser diode vary due to heat produced during operation. As a result, it is difficult to manufacture a laser diode which can attain stable operation and output within a specified temperature range. Therefore, a nitride semiconductor device having a decreased contact resistance between a P-type contact layer and a P-type electrode is required.

SUMMARY OF THE INVENTION

An object of the present invention is to provide a nitride semiconductor device having a P-type electrode with a low resistance and a method of manufacturing the same.

A nitride semiconductor device according to one aspect of the present invention includes a P-type contact layer of a nitride semiconductor, an AuGa film provided on the P-type contact layer, and an Au film provided on the AuGa film. According to this construction, a nitride semiconductor device can be obtained which has a P-type electrode with a low contact resistance between a P-type contact layer and the P-type electrode.

A nitride semiconductor device according to another aspect of the present invention includes a P-type contact layer of a nitride semiconductor, an Au film provided on the P-type contact layer, and an AuGa film provided on the Au film. According to this construction, a nitride semiconductor device can be obtained which has a P-type electrode with a low contact resistance between a P-type contact layer and the P-type electrode.

A nitride semiconductor device according to a further aspect of the present invention includes a P-type contact layer of a nitride semiconductor, and an alloy layer of AuGa and Au provided on the P-type contact layer. According to this construction, a nitride semiconductor device can be obtained which has a P-type electrode with a low contact resistance between a P-type contact layer and the P-type electrode.

When the nitride semiconductor device as described above is used in a laser diode, an operation voltage for operating the laser diode is decreased and variations in properties of the laser diode due to heat produced during operation are decreased. As a result, a laser diode which can attain stable operation and output within a specified temperature range is obtained.

A method of manufacturing a nitride semiconductor device according to one aspect of the present invention includes the steps of forming an AuGa film on a P-type contact layer of a nitride semiconductor, forming an Au film on the AuGa film, and heat-treating the AuGa film and the Au film. According to this method, a nitride semiconductor device can be manufactured which has a P-type electrode with a low contact resistance between a P-type contact layer and the P-type electrode.

A method of manufacturing a nitride semiconductor device according to another aspect of the present invention includes the steps of forming an Au film on a P-type contact layer of a nitride semiconductor, forming an AuGa film on the Au film, and heat-treating the AuGa film and the Au film. According to this method, a nitride semiconductor device can be manufactured which has a P-type electrode with a low contact resistance between a P-type contact layer and the P-type electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
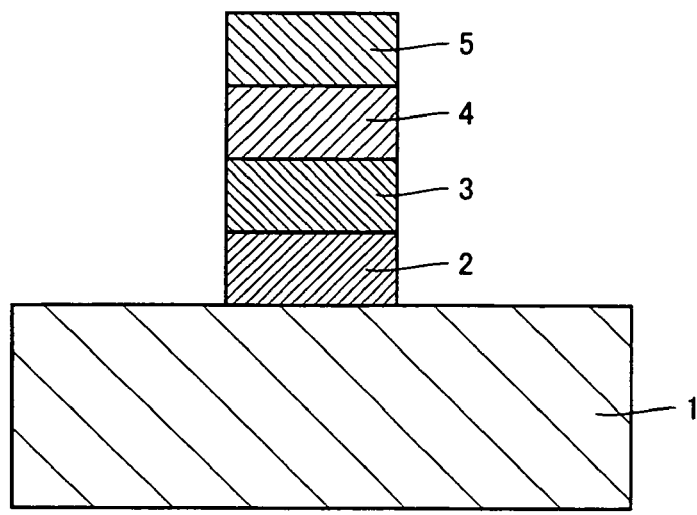
FIG. 1 is a cross-sectional view of a nitride semiconductor device of a first embodiment of the present invention.

A nitride semiconductor device according to a first embodiment of the present invention is described using FIG. 1. As shown in FIG. 1, a P-type electrode is provided on a P-type contact layer 1 in the semiconductor device of this embodiment. The P-type electrode is formed with an AuGa film 2, an Au film 3, a Pt film 4, and an Au film 5. AuGa film 2 is provided on P-type contact layer 1. Au film 3 is provided on AuGa film 2. Pt film 4 is provided on Au film 3. Au film 5 is provided on Pt film 4. In the nitride semiconductor device described above, a P-type $Al_xGa_{1-x}N$ ($0 \leq x \leq 1$) is used as P-type contact layer 1 which is a nitride semiconductor.

Figure 2:
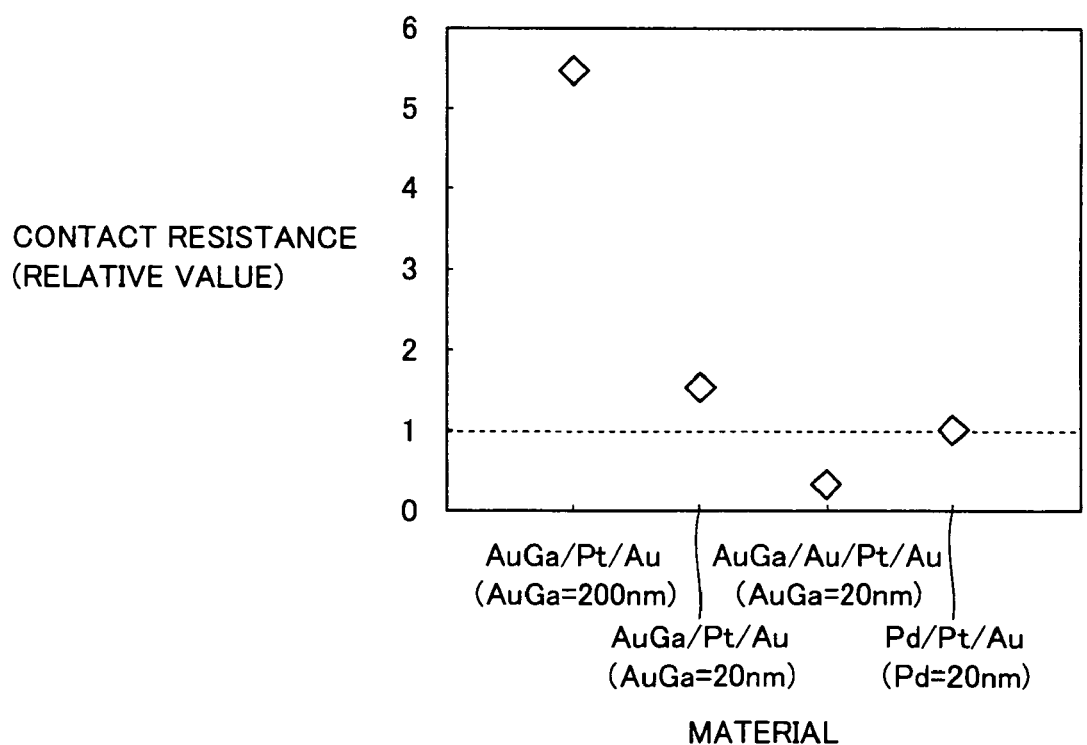
FIG. 2 is a graph indicating a relationship between a material of a P-type electrode and a relative value of a contact resistance.

Next, a relationship between a material of a P-type electrode and a relative value of a contact resistance is described using FIG. 2. The relative value of the contact resistance of the P-type electrode indicated in FIG. 2 is a ratio to a contact resistance of a conventional P-type electrode using a Pd film. In this specification, "a relative value of a contact resistance" hereafter means a ratio of a contact resistance of a P-type electrode of the embodiment to the contact resistance of the conventional P-type electrode using the Pd film.

FIG. 2 indicates that a P-type electrode only having AuGa film 2 provided between the Pt film and the P-type contact layer has a higher contact resistance as compared to the P-type electrode using the conventionally used Pd film. FIG. 2 also indicates that a contact resistance of AuGa film 2 having a thickness of 200 nm is higher than a contact resistance of AuGa film 2 having a thickness of 20 nm. In contrast, it is indicated that a contact resistance in the P-type electrode of this embodiment having an AuGa/Au structure provided between the Pt film and the P-type contact layer is decreased by about 70% as compared to the conventional electrode using the Pd film. Therefore, it is apparent that, in place of the AuGa film alone, a two-layer structure formed with the AuGa film and the Au film must be provided between the Pt film and the P-type contact layer to obtain the P-type electrode having a low resistance.

Figure 3:
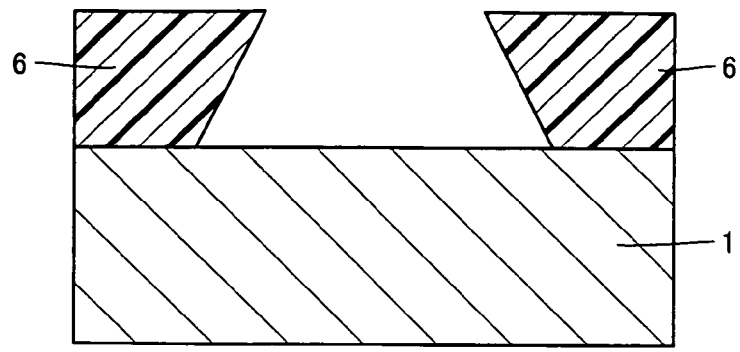
FIGS. 3-5 are cross-sectional views for describing a method of manufacturing the nitride semiconductor device of the first embodiment of the present invention.
Figure 4:
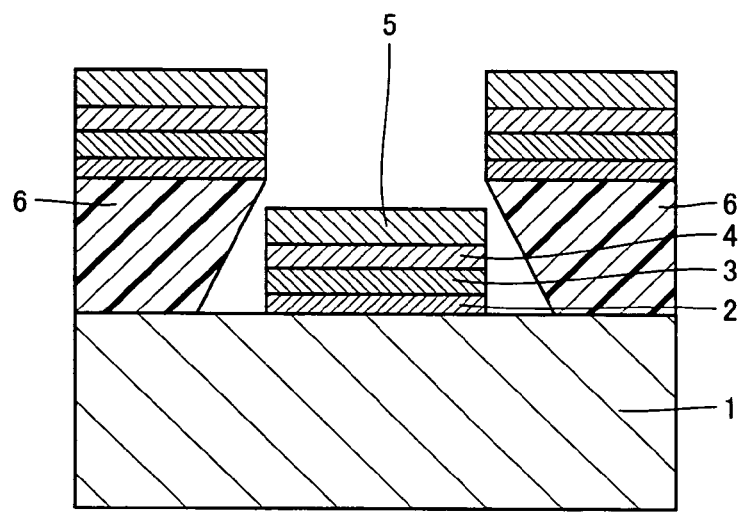
Figure 5:
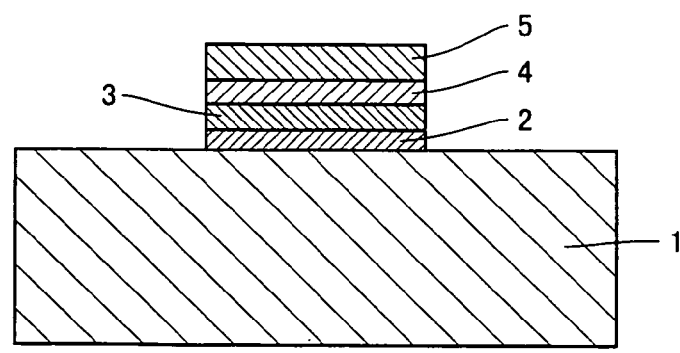

Next, a method of manufacturing the nitride semiconductor device of this embodiment is described using FIGS. 3-8. First, as shown in FIG. 3, a resist film 6 for selectively forming the P-type electrode is formed on P-type contact layer 1. Then, as shown in FIG. 4, AuGa film 2, Au film 3, Pt film 4, and Au film 5 forming the P-type electrode are deposited in this order on P-type contact layer 1 and resist film 6 by a method such as electron beam (EB) deposition. Thereafter, an unneeded P-type electrode material on resist film 6 is removed together with resist film 6 by a lift off method. With this, the P-type electrode material remains only on P-type contact layer 1, as shown in FIG. 5. Thereafter, a structure shown in FIG. 5 is heat-treated to form the P-type electrode. This P-type electrode has a low contact resistance value, as described above.

Figure 6:
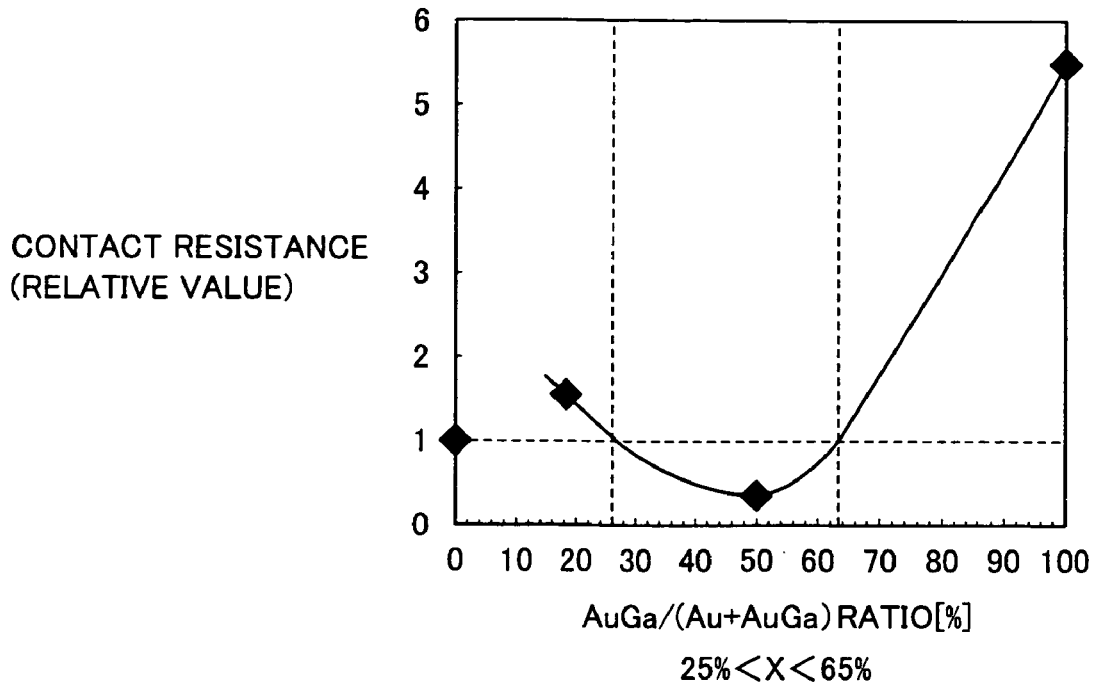
FIG. 6 is a graph indicating a relationship between a film thickness ratio of AuGa/(Au+AuGa) and a relative value of a contact resistance, which is obtained by an experiment.

Next, a relationship between a relative value of a contact resistance and a ratio of a thickness of AuGa film 2 to a total thickness of Au film 3 and AuGa film 2 is described using FIG. 6. To manufacture a nitride semiconductor device having a lower resistance than a conventional one, a relative value of a contact resistance with the AuGa/Au structure of this embodiment to a contact resistance with conventional Pd must be lower than 1. In other words, when the relative value of the contact resistance is not less than 1, an effect of decrease in the contact resistance is not obtained as compared to the conventional one. Therefore, as is obvious from experimental results shown in FIG. 6, a ratio Y of a thickness of AuGa film 2 to a total thickness of Au film 3 and AuGa film 2 is desirably about $25\% \leq Y \leq 65\%$.

As the experimental results, when ratios of the thickness of AuGa film 2 to the total thickness of Au film 3 and AuGa film 2 are 18%, 50% and 100%, respective relative values of contact resistances are 1.53, 0.32 and 5.47, as plotted in FIG. 6. In addition, an experimental result of a conventional Pd film as a reference for comparison is plotted on coordinates of AuGa/(Au+AuGa)=0% and contact resistance=1 in FIG. 6.

Figure 7:
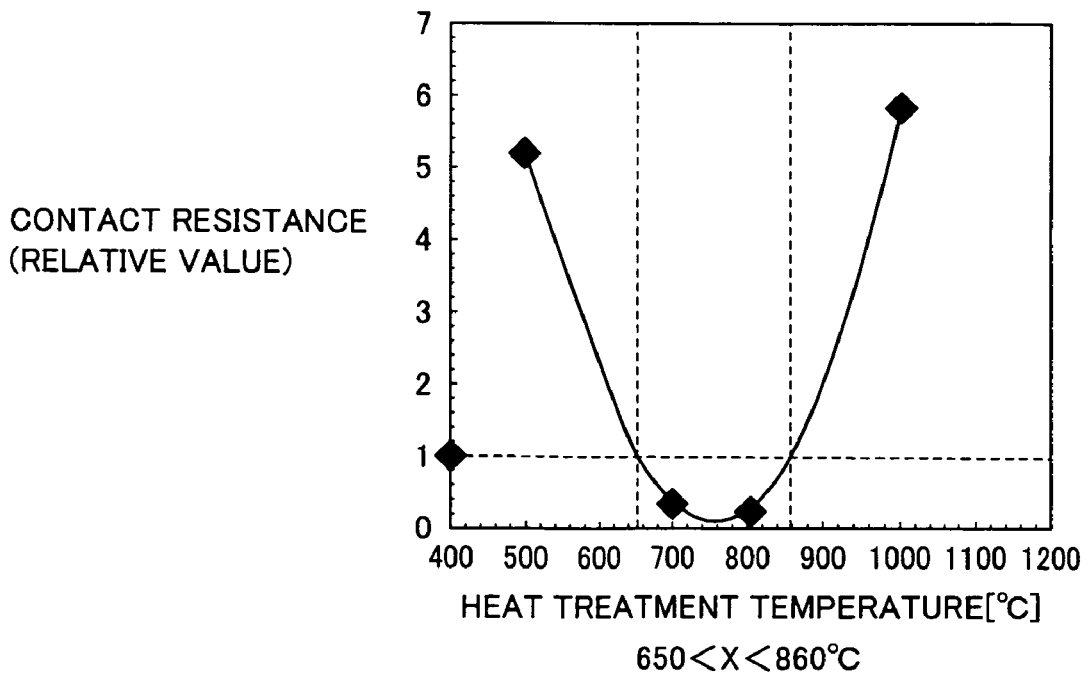
FIG. 7 is a graph indicating a relationship between a heat treatment temperature and a relative value of a contact resistance, which is obtained by an experiment.

FIG. 7 indicates a relationship between a heat treatment temperature and a relative value of a contact resistance. As is seen from FIG. 7, a temperature of heat treatment is desirably at least 650° C. and at most 860° C. to make the relative value of the contact resistance lower than 1. It is to be noted that, a heat treatment atmosphere is desirably air, nitrogen, oxygen, or an inert gas.

As experimental results, when heat treatment temperatures are 500° C., 700° C., 800° C., and 1000° C., respective relative values of contact resistances are 5.17, 0.32, 0.147, and 5.79, as plotted in FIG. 7. In addition, an experimental result of the conventional Pd film as a reference for comparison is plotted on coordinates of heat treatment temperature=400° C. and contact resistance=1 in FIG. 7.

Figure 8:
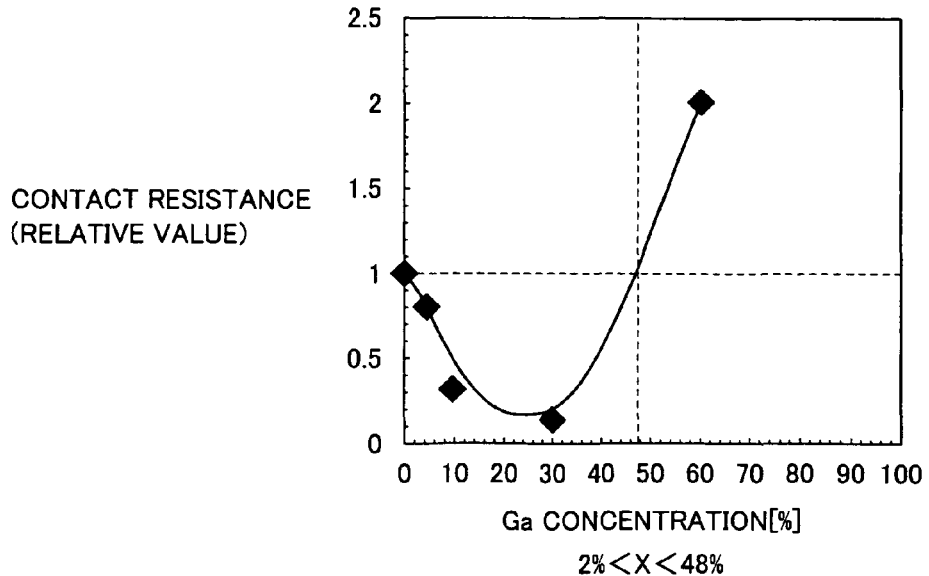
FIG. 8 is a graph indicating a relationship between a concentration of Ga atoms in an AuGa film and a relative value of a contact resistance, which is obtained by an experiment.

FIG. 8 indicates a relationship between a concentration of Ga atoms in AuGa film 2 and a relative value of a contact resistance. The Ga atoms in AuGa film 2 are used to attract nitrogen atoms (N) in P-type contact layer 1. As is seen from FIG. 8, an effect of attracting the nitrogen atoms is not sufficiently obtained when a ratio of Ga atoms in AuGa film 2 is lower than 2%. In contrast, when the ratio of Ga atoms in AuGa film 2 becomes higher than 48%, the Ga atoms excessively attract the nitrogen atoms to make a portion near a surface of P-type contact layer 1 have a property similar to that of an N-type semiconductor, which increases a contact resistance between P-type contact layer 1 and AuGa film 2. Therefore, the ratio of Ga atoms in AuGa film 2 is desirably at least about 2% and at most about 48%.

As experimental results, when concentrations of Ga atoms in AuGa film 2 are 5%, 10%, 30%, and 60%, respective relative values of contact resistances are 0.8, 0.32, 0.15, and 2.0, as plotted in FIG. 8. In addition, an experimental result of the conventional Pd film as a reference for comparison is plotted on coordinates of Ga concentration=0% and contact resistance=1 in FIG. 8.

According to the method of manufacturing the nitride semiconductor device in this embodiment as described above, with heat treatment, nitrogen atoms in P-type contact layer 1 are attracted by Ga atoms in AuGa film 2 to the portion near the surface of P-type contact layer 1 as a P-type semiconductor. With this, in the portion near the surface of P-type contact layer 1, nitrogen vacancies in P-type contact layer 1 are filled with attracted nitrogen atoms. As a result, a property of the portion near the surface of the P-type semiconductor forming P-type contact layer 1 is inhibited from becoming similar to a property of the N-type semiconductor.

In addition, Ga atoms in the portion near the surface of P-type contact layer 1 are drawn from contact layer 1 into AuGa film 2 by a function of Au film 3. With this, a P-type property of the portion near the surface of the P-type semiconductor becomes stronger. Furthermore, an acceptor impurity is captured in Ga vacancies in P-type contact layer 1. With this, the P-type property of the portion near the surface of the P-type semiconductor becomes stronger. Therefore, a concentration of a carrier in the portion near the surface of P-type contact layer 1 is increased. As a result, the P-type electrode having a low resistance is obtained.

Figure 9:
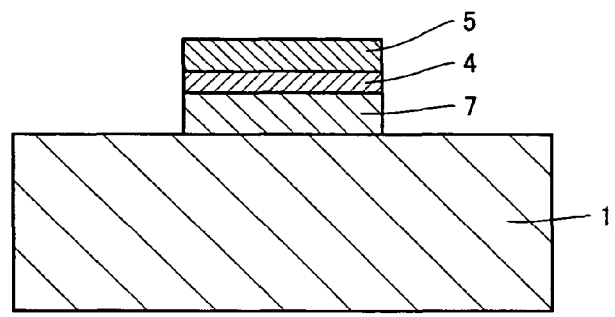
FIG. 9 is a cross-sectional view of a modified example of nitride semiconductor devices of first and second embodiments of the present invention.

Depending on a condition of the heat treatment, AuGa film 2 and Au film 3 may remain as separate layers as shown in FIG. 1, or AuGa film 2 and Au film 3 may be alloyed with each other to form an alloy film 7 as shown in FIG. 9. When AuGa film 2 and Au film 3 are alloyed, Ga atoms are distributed in alloy film 7. It is to be noted that, distribution of Ga atoms is desirably uneven before performance of the heat treatment.

As described above, the contact resistance between the P-type contact layer and the P-type electrode can be decreased using the AuGa/Au structure as a structure of a contact portion between the P-type electrode and P-type contact layer 1. Consequently, an operation voltage is decreased and a deleterious effect due to production of heat is suppressed in the nitride semiconductor device having the P-type electrode. As a result, when the nitride semiconductor device of this embodiment is used in a laser diode, for example, the laser diode operates stably and has an increased output.

Second Embodiment

Figure 10:
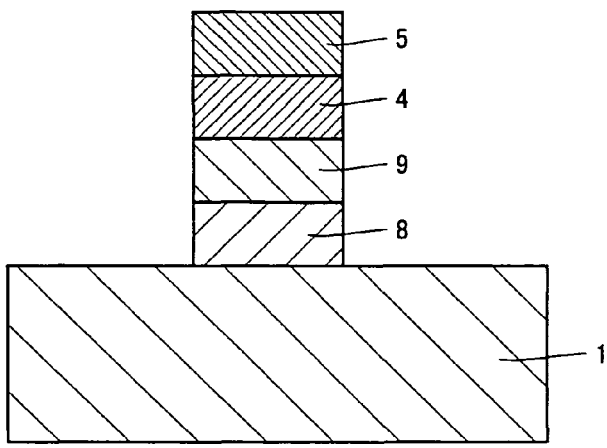
FIG. 10 is a cross-sectional view of the nitride semiconductor device of the second embodiment of the present invention.

A nitride semiconductor device of a second embodiment of the present invention is described using FIG. 10. In the nitride semiconductor device of this embodiment, a P-type electrode material is provided on a top surface of P-type contact layer 1. The P-type electrode is formed with an Au film 8, an AuGa film 9, Pt film 4, and Au film 5. Au film 8 is provided on P-type contact layer 1. AuGa film 9 is provided on Au film 8. Pt film 4 is provided on AuGa film 9. Au film 5 is provided on Pt film 4.

Next, a method of manufacturing the nitride semiconductor device having a structure as described above is described. The method of manufacturing is basically similar to that in the first embodiment described using FIGS. 3-5. The method of manufacturing the nitride semiconductor device of this embodiment, however, has an order of deposition of materials forming the P-type electrode different from that in the method of manufacturing the nitride semiconductor device of the first embodiment.

Figure 11:
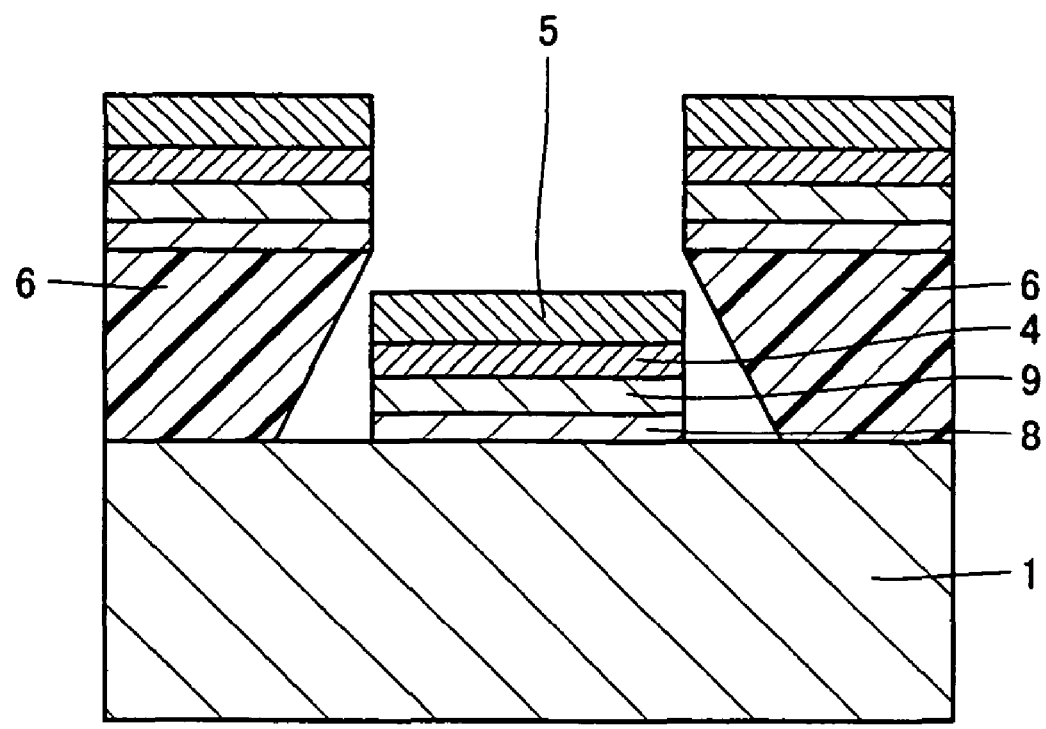
FIG. 11 is a cross-sectional view for describing a method of manufacturing the nitride semiconductor device of the second embodiment of the present invention.

In the method of manufacturing the nitride semiconductor device of this embodiment, first, resist film 6 for selectively forming the P-type electrode is formed on P-type contact layer 1. Then, as shown in FIG. 11, Au film 8, AuGa film 9, Pt film 4, and Au film 5 as the P-type electrode material are deposited in this order by a method such as electron beam (EB) deposition. Thereafter, an unneeded P-type electrode material on resist film 6 is removed together with resist film 6 by a lift off method. With this, the P-type electrode material remains only on P-type contact layer 1, as shown in FIG. 10. Then, a structure shown in FIG. 10 is heat-treated. With this, as shown in FIG. 9, Au film 8 and AuGa film 9 are alloyed with each other to form Au/AuGa alloy film 7, as in the nitride semiconductor device of the first embodiment. In this embodiment, it is also possible that Au film 8 and AuGa film 9 do not form alloy film 7 as shown in FIG. 9 but remain as independent layers as shown in FIG. 10, depending on a condition of heat treatment.

It is to be noted that, as the P-type electrode of the first embodiment, the P-type electrode having a structure shown in each of FIGS. 9 and 10 has a lower contact resistance with P-type contact layer 1 as compared to the conventional P-type electrode using the Pd film. That is, in this embodiment, the contact resistance between P-type contact layer 1 and the P-type electrode material can be decreased using an Au/AuGa structure as the P-type electrode material.

In addition, in the nitride semiconductor device of this embodiment, relationships similar to the relationship between a film thickness ratio of AuGa/(Au+AuGa) and the relative value of the contact resistance shown in FIG. 6, the relationship between the heat treatment temperature and the relative value of the contact resistance shown in FIG. 7, and the relationship between the concentration of Ga atoms in the AuGa film and the relative value of the contact resistance shown in FIG. 8 are also obtained. Therefore, numerical limitations similar to those for the nitride semiconductor device of the first embodiment can be applied to the nitride semiconductor device of this embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor device, comprising:
  a P-type contact layer of a nitride semiconductor;
  an AuGa film consisting of Au and Ga deposited on and directly contacting only a portion of a region inside a periphery of a surface of said P-type contact layer; and
  an Au film consisting of Au deposited on and directly contacting a surface of said AuGa film.

2. The nitride semiconductor device according to claim 1, wherein a ratio of a thickness of said AuGa film to a total thickness of said Au film and said AuGa film is at least 25% and at most 65%.

3. A nitride semiconductor device, comprising:
  a P-type contact layer of a nitride semiconductor;
  an AuGa film deposited on and directly contacting only a portion of a region inside a periphery of a surface of said P-type contact layer; and
  an Au film deposited on and directly contacting a surface of said AuGa film, wherein said AuGa film has a Ga atom content of at least 2% and at most 48%.

4. The nitride semiconductor device according to claim 3, wherein
  a ratio of a thickness of said AuGa film to a total thickness of said Au film and said AuGa film is at least 25% and at most 65%.

* * * * *